(12) United States Patent  (10) Patent No.: US 7,719,293 B2
Farkas  (45) Date of Patent: May 18, 2010

(54) SYSTEM AND METHOD FOR CURRENT MEASUREMENT

(75) Inventor: Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 261 days.

(21) Appl. No.: 11/938,323

(22) Filed: Nov. 12, 2007

(65) Prior Publication Data

US 2009/0121729 A1   May 14, 2009

(51) Int. Cl.
*G01R 27/08* (2006.01)
(52) U.S. Cl. ..................................... 324/713
(58) Field of Classification Search ................ 324/713
See application file for complete search history.

(56) References Cited

U.S. PATENT DOCUMENTS

| | | | | |
|---|---|---|---|---|
| 5,220,519 | A | | 6/1993 | Eller .......................... 364/579 |
| 5,804,979 | A | * | 9/1998 | Lund et al. ................... 324/713 |
| 6,400,163 | B1 | * | 6/2002 | Melcher et al. ............. 324/713 |
| 6,420,858 | B1 | * | 7/2002 | Kitagawa et al. ............ 323/282 |
| 6,717,389 | B1 | * | 4/2004 | Johnson ...................... 323/282 |
| 6,931,579 | B2 | | 8/2005 | Roberts et al. .............. 714/724 |
| 7,176,665 | B2 | * | 2/2007 | Knoedgen et al. ............ 323/282 |
| 7,183,756 | B1 | * | 2/2007 | Dikken et al. ................ 323/280 |
| 7,262,628 | B2 | * | 8/2007 | Southwell et al. ........... 324/769 |
| 7,492,171 | B2 | | 2/2009 | Vogman ....................... 324/721 |
| 2005/0032488 | A1 | * | 2/2005 | Pehlke et al. ............. 455/127.1 |
| 2006/0001408 | A1 | * | 1/2006 | Southwell et al. ........... 323/282 |
| 2006/0066366 | A1 | * | 3/2006 | Oliver, Jr. .................... 327/111 |
| 2007/0257650 | A1 | * | 11/2007 | Southwell et al. ........... 323/283 |
| 2007/0274015 | A1 | * | 11/2007 | Isham ........................ 361/93.1 |

\* cited by examiner

*Primary Examiner*—Timothy J Dole
(74) *Attorney, Agent, or Firm*—Hamilton & Terrile, LLP; Robert W. Holland (57) ABSTRACT

Load current of a circuit is determined across a component of the circuit by calibrating the resistance of the component with a reference current having a distinguishable characteristic. For example, a reference current with swept frequency modulation is applied to the component so that the resistance of the component is determined from voltage drop associated with the reference current across the component. The component resistance is applied to a voltage drop associated with the load current to determine the load current. For example, a filter matched to the reference current frequency modulation isolates the reference current voltage drop so that a ratio of the reference current voltage drop and the load current voltage drop provides a ratio of the reference current and load current.

5 Claims, 7 Drawing Sheets

SYSTEM AND METHOD FOR CURRENT MEASUREMENT

BACKGROUND OF THE INVENTION

1. Field of the Invention

The present invention relates in general to the field of information handling system circuits, and more particularly to a system and method for current measurement.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems perform most processing functions with integrated circuits (ICs), however, a number of other electrical circuits are typically included so that the ICs can communicate with each other and have power. Generally, IC communication and power circuits run through printed circuit boards (PCBs), such as a motherboard and daughter boards. The motherboard typically supports a central processing unit (CPU), chipset and memory, such as RAM, while daughter boards typically interface with the motherboard to support specific functions, like graphics. ICs typically operate with power supplied through power pins at a defined constant voltage. In some instances, the power drawn by an IC varies dramatically during normal operations, such as when a CPU transitions from an idle state having minimal computations to an active state performing complex operations. As the number of transistors on CPUs continues to increase, variations in power demanded by CPUs during normal operating conditions also tends to increase. Precise power management also presents a challenge in other information handling system applications, such as with hot-swap controllers.

Precise power management generally calls for precise current measurement at various locations throughout an information handling system. One common method of current measurement is a Hall sensor that measures the magnetic field around the current conductor. However, Hall sensors are relatively expensive. A less expensive method for current measurement is to flow the current through a precision shunt resistor and measure the voltage drop across the shunt resistor. In order to accurately measure current, the shunt resistor is built to provide a constant resistance across a variety of operating conditions, such as variations in temperature. A difficulty with shunt resistors is that the voltage drop across the shunt resistor wastes power and produces heat as a byproduct of the current measurement. Other less precise resistors are sometimes used to detect overcurrent situations. For example, a MOSFET Rdson detects an overcurrent by assuming a nominal resistance value and measuring the voltage drop across the resistance. Precise current measurements are not attempted since a precise resistance value is not known, however, for determining gross overcurrent conditions, such as might result from a short to ground, the nominal resistance value provides an accurate enough estimation.

SUMMARY OF THE INVENTION

Therefore a need has arisen for a system and method which measures current by a voltage drop across a resistor having variable resistance values.

In accordance with the present invention, a system and method are provided which substantially reduce the disadvantages and problems associated with previous methods and systems for measuring current. A reference current having a distinguishable characteristic is added to a load current at a component of an electrical circuit. Voltage drop associated with the reference current is isolated to calibrate the resistance of the electrical component. The resistance determined for the electrical component is applied to the voltage drop of the load current across the electrical component to determine the load current.

More specifically, an information handling system has plural processing components to process information. A power supply provides power to the processing components with a variety of electronic components, such as a MOSFET, copper wire lines and connectors. A current detector interfaces with a selected component, such as a MOSFET, and applies a reference current having a distinguishable characteristic at the selected component in addition to the load current in order to calibrate the resistance of the selected component. The calibrated resistance of the component is determined and applied in order to determine the load current across the component. For instance, a differential amplifier measures the total drop in voltage across the component. A component resistance detector has a first filter that isolates the drop in voltage associated with the reference current and a second filter that isolates the drop in voltage associated with the load current. A load current detector generates a ratio of the first and second voltage drops to cancel the resistance and leave the ratio of the reference current and load current. One example of a distinguishable characteristic is frequency modulation, such as swept frequency modulation that is isolated with a matched filter having a peak voltage hold.

The present invention provides a number of important technical advantages. One example of an important technical advantage is that current measurement becomes possible across virtually any resistance by monitoring the value of the resistance as current measurements are taken. This reduces the expense of current measurement by reducing or eliminating the need to add resistors to a circuit solely for the purpose of current measurement. Instead, existing resistance is used to measure current by monitoring the resistance value as current is measured. Avoiding the use of precision shunt resistors improves the efficiency with which information handling systems use power and reduce heat produced by information handling system operation. Further, avoiding the use of precision shunt resistors helps prevent the design of power systems having a single point of failure at the shunt resistor.

BRIEF DESCRIPTION OF THE DRAWINGS

The present invention may be better understood, and its numerous objects, features and advantages made apparent to FIG. 1 depicts a block diagram of an information handling system that applies resistance measurements across an electronic component to determine a load current across the electronic component.

DETAILED DESCRIPTION

Load current across an information handling system circuit is determined by measuring resistance of a component in the circuit and voltage drop across the component. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
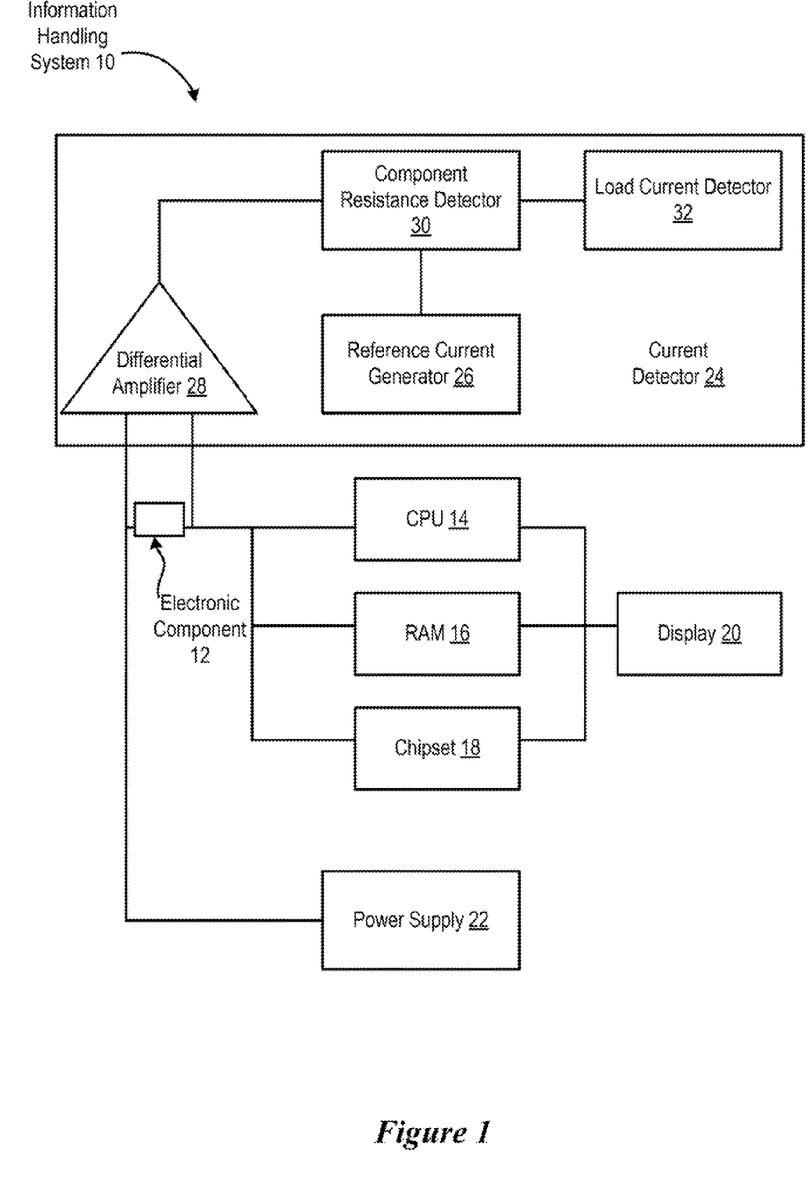

Referring now to FIG. 1, a block diagram depicts an information handling system 10 that applies resistance measurements across an electronic component 12 to determine a load current across the electronic component 12. Information handling system 10 is built from a variety of processing components that cooperate to process information, such as a CPU 14, RAM 16, chipset 18 and a display 20. Power is provided to the processing components by a power supply 22, which, for example, provides a constant voltage to the processing components through a circuit having electronic component 12. For instance, electronic component 12 is a MOSFET, such as a switch used in a voltage regulator, or other portion of the power supply circuit, such as a power distribution copper wire line or a connector. Rather than determining the load current to a processing component by determining the voltage drop across a shunt resistor, a current detector 24 determines the load current by the voltage drop across electronic component 12 based upon a concurrent measurement of the resistance across electronic component 12. A reference current generator 26 adds a small reference current to the circuit proximate electronic current 12. The load current and reference current are detected at a differential amplifier 28, which measures the voltage drop across electronic component 12. A component resistance detector 30 determines the resistance of component 12 by analyzing the voltage drop of the reference current across component 12. Based upon the determined resistance, a load current detector 32 measures the load current with the voltage drop of the load current across component 12 and the resistance of electronic component 12 as determined from the reference current.

Figure 2:
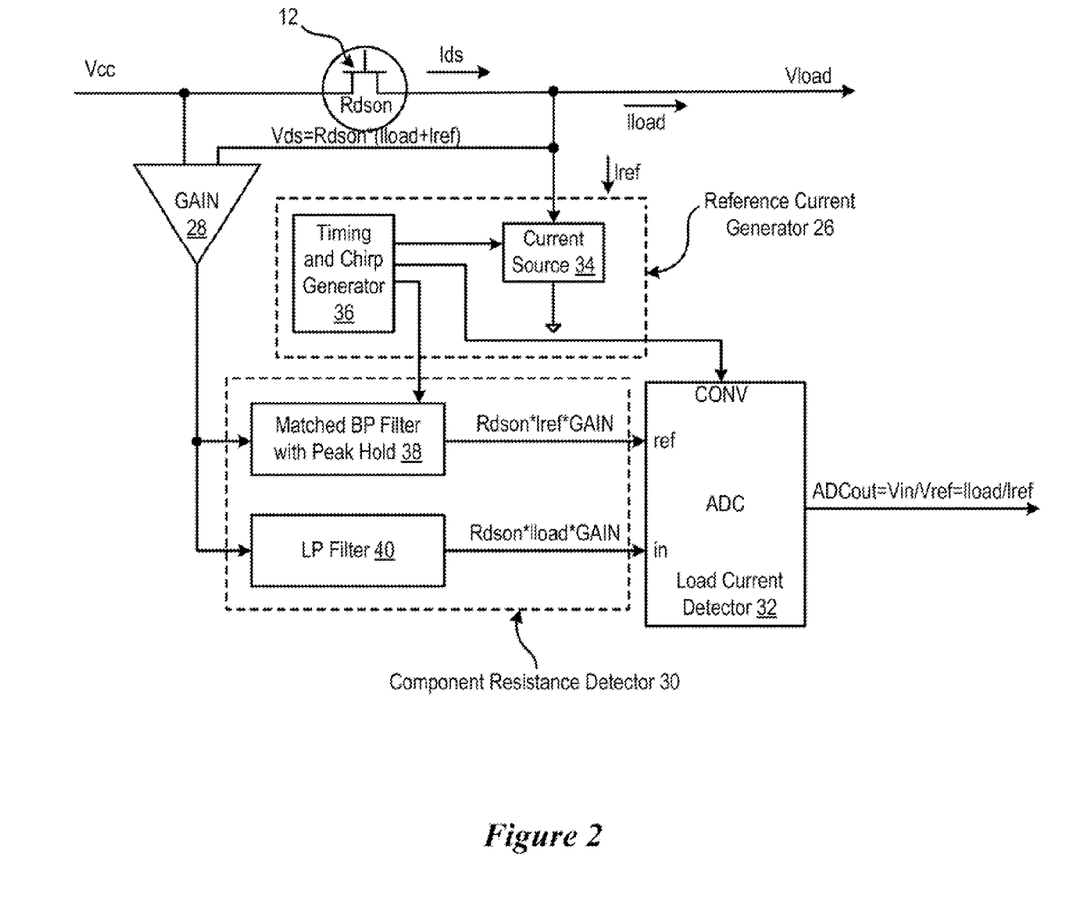
FIG. 2 depicts a circuit diagram of an analog circuit that measures a load current across a MOSFET by using a reference current to determine the resistance across the MOSFET.

Referring now to FIG. 2, a circuit diagram depicts an analog circuit that measures a load current across a MOSFET 12 by using a reference current to determine the resistance Rdson across MOSFET 12. The resistance Rdson across MOSFET 12 is generally linear at the operating point but tends to change with temperature and other factors. A small reference current Iref is added to the load current Iload by a current source 34 to provide a reference for calibration of the resistance across MOSFET 12. The total voltage Vds across MOSFET 12 is $$Vds = Vload + Vref = Rdson*(Iload + Iref).$$

By isolating the voltage Vref of the reference current from the total voltage Vds Rdson is calculated with the known value of Iref.

To allow for the isolation of Vref, Iref is provided with a distinguishable characteristic, such as spreading the Iload in the frequency domain to widen and lower its power spectrum relative to Iref so that Iload is more easily filtered out and rejected. Since the Iload is not controlled or adjustable, a timing and chirp generator 36 instead spreads the reference current using frequency modulation of the time base at generation of the reference current. The frequency modulation timing is provided to load current detector 32, depicted in the example embodiment as an analog-to-digital converter and to a matched bandpass filter 38 having peak voltage hold. Component resistance detector 30 compares the filtered signal from matched bandpass filter 38 with the signal from a lowpass filter 40 to analyze the resistance of MOSFET 12. For example, the clock frequency over bandpass filter center frequency ratio of filter 38 is constant and equal to the division rate of the counter of the ADC load current detector 32. As timing and chirp generator 36 provides a swept "chirp" clock signal having increasing or decreasing frequency for Iref, filter 38 and ADC clock of load current detector 32 also increase or decrease. The peak to peak voltage of filter 38 is captured so the Vds output from filter 38 equals Iref times Rdson times the Gain provided by differential amplifier 28. Lowpass filter 40 outputs a lowpass of Vds which equals Iload times Rdson times Gain of differential amplifier 28. The output from ADC 32 Vin/Vref, which is:

$$Vds(\text{lowpass})/Vds(\text{bandpath}) = (Iload*Rdson*Gain)/(Iref*Rdson*Gain) = Iload/Iref.$$

Since Rdson and gain cancel out, the output of ADC 32 is proportional to Iload. In one embodiment, the output of ADC 32 is captured at plural frequencies within the "chirp" bandwidth and averaged to improve the accuracy of Iload measurements.

Figure 3A:
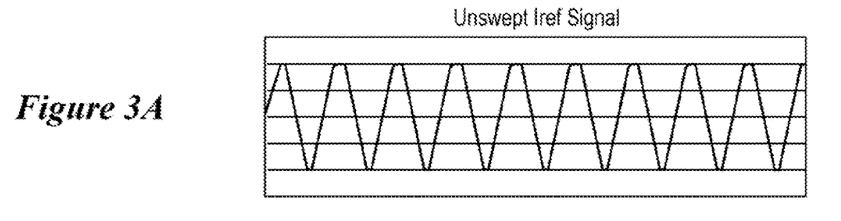
FIG. 3 depicts examples of load and reference signals provided from the analog embodiment of FIG. 2.
Figure 3B:
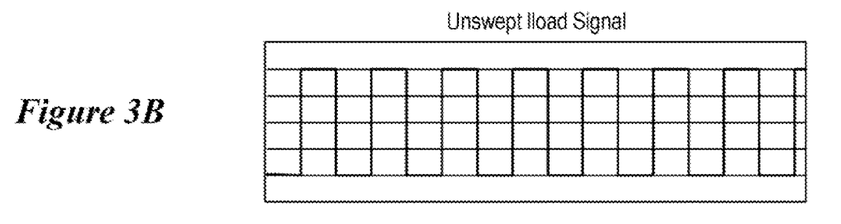
Figure 3C:
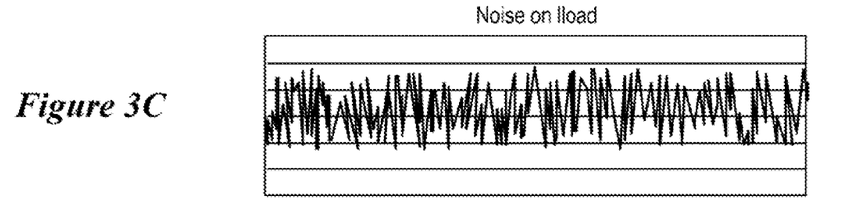
Figure 3D:
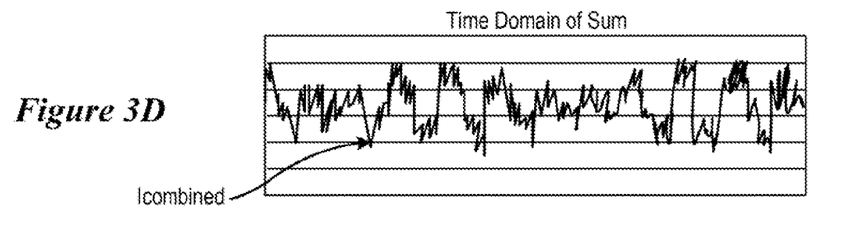
Figure 3E:
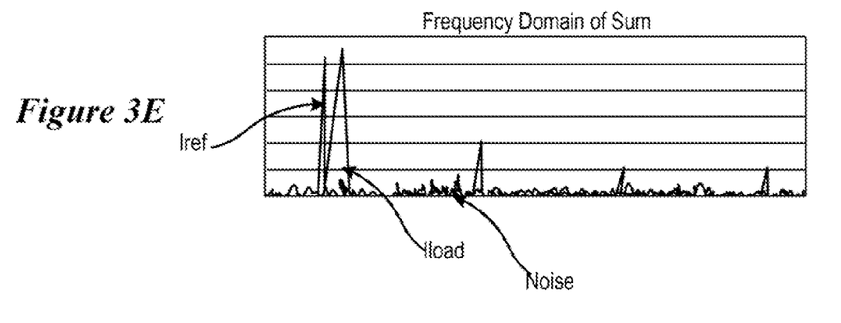
Figure 3F:
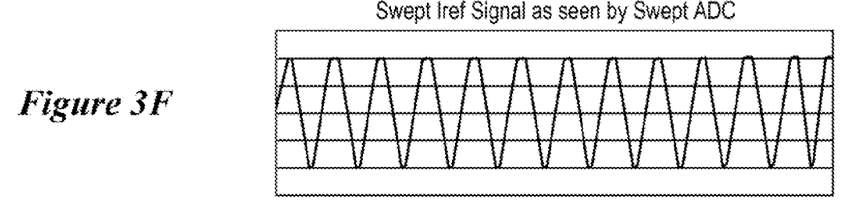
Figure 3G:
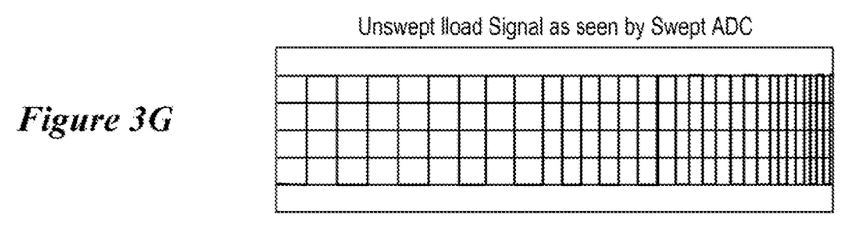
Figure 3H:
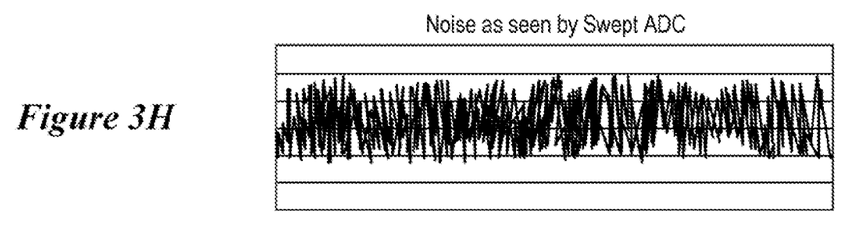
Figure 3I:
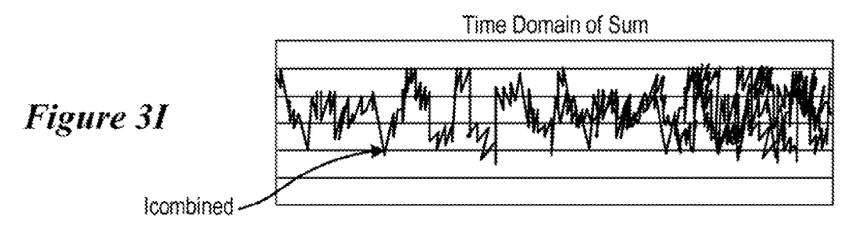
Figure 3J:
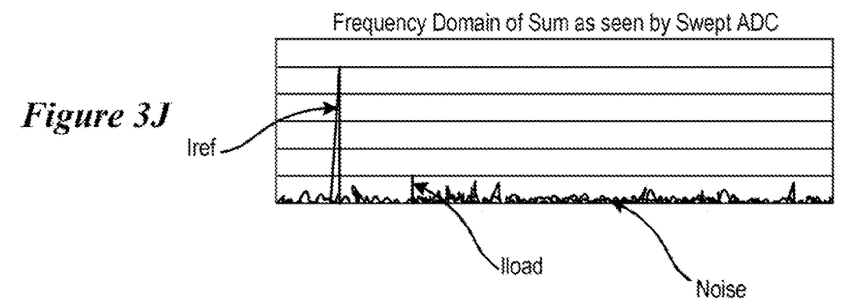

Referring now to FIGS. 3a-3j, examples of load and reference signals provided from the analog embodiment of FIG. 2 are depicted. From Iload's point of view, Iref is a swept waveform while, form Iref's point of view, Iload is a swept waveform. This effectively randomizes Iload and turns it into broadband noise with a lower amplitude, thus providing improved signal to noise ratio for Iref even without filtering. Due to the synchronous time base, the swept "chirp" appears as a non-modulated sine wave so that the matching bandpass filter is narrowband. FIGS. 3a-3e depict an unmodulated system while FIGS. 3f-3j depict a swept chirp wave system. The combination of an unswept Iref signal of FIG. 3a, unswept Iload signal of FIG. 3b and noise included in the Iload signal of FIG. 3c provides the time domain sum Icombined depicted in FIG. 3d. The spectral components in the frequency domain sum depicted in FIG. 3e does not allow isolation of Iref relative to Iload and noise. However, sweeping of Iref relative to Iload, as is depicted by FIGS. 3f-3j, provides a more clearly distinguishable frequency domain value for Iref. Since Iload as seen by ADC 32 in FIG. 3g is swept relative to Iref, the frequency domain sum of Iload blends with noise in FIG. 3j so that the value of Iref is clearly defined.

Figure 4:
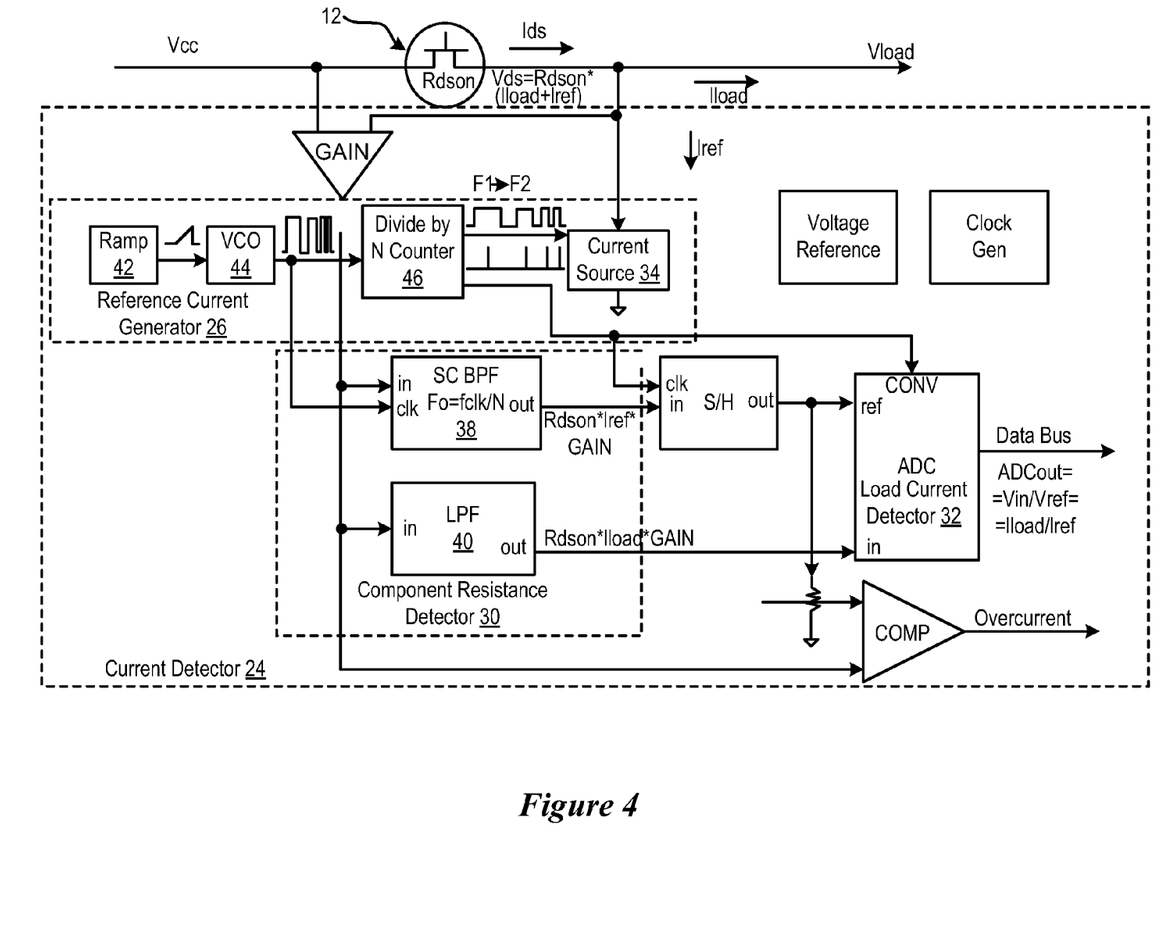
FIG. 4 depicts an example of an analog circuit for detection of a current load across a MOSFET.
Figure 5:
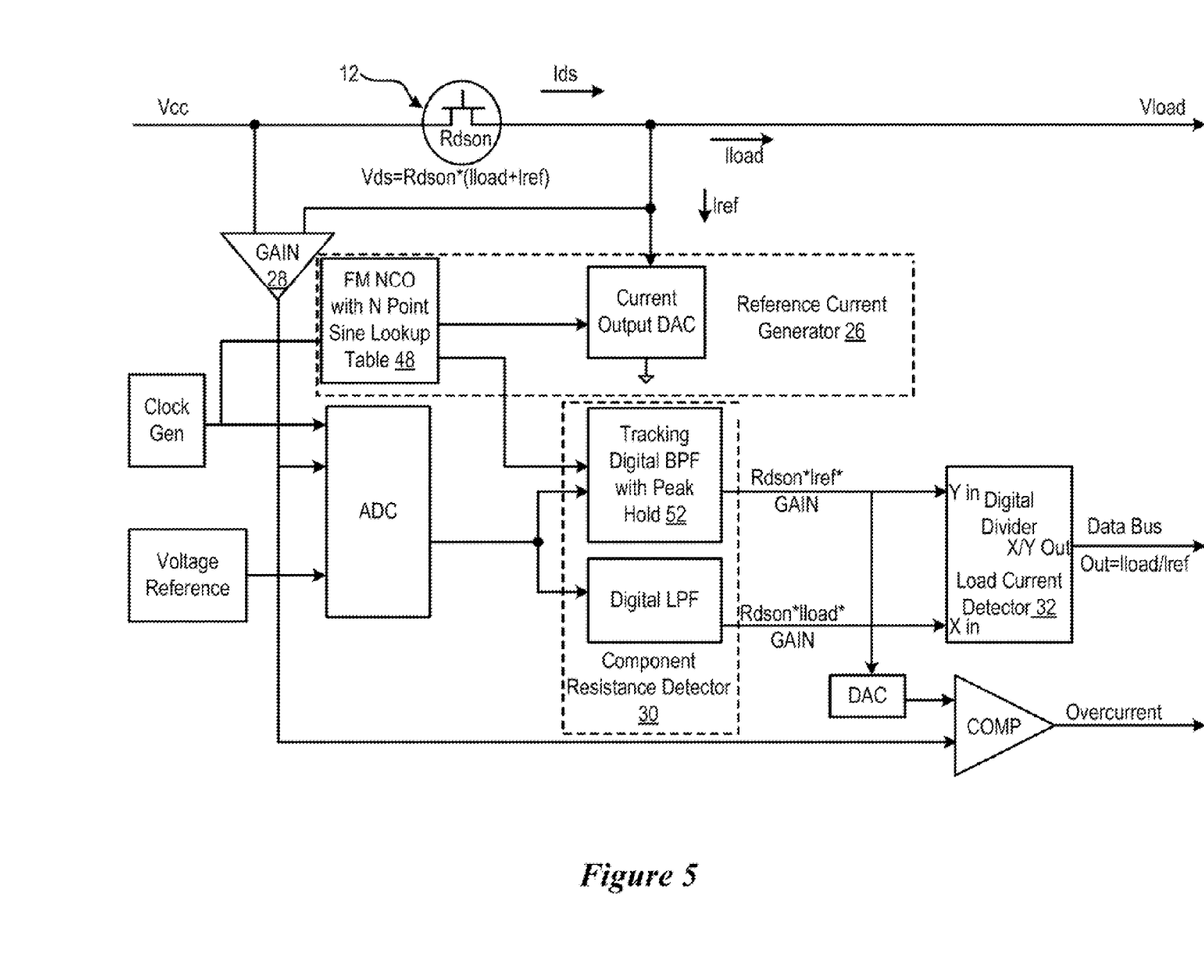
FIG. 5 depicts an example of a digital circuit for detection of a current load across a MOSFET.
Figure 6:
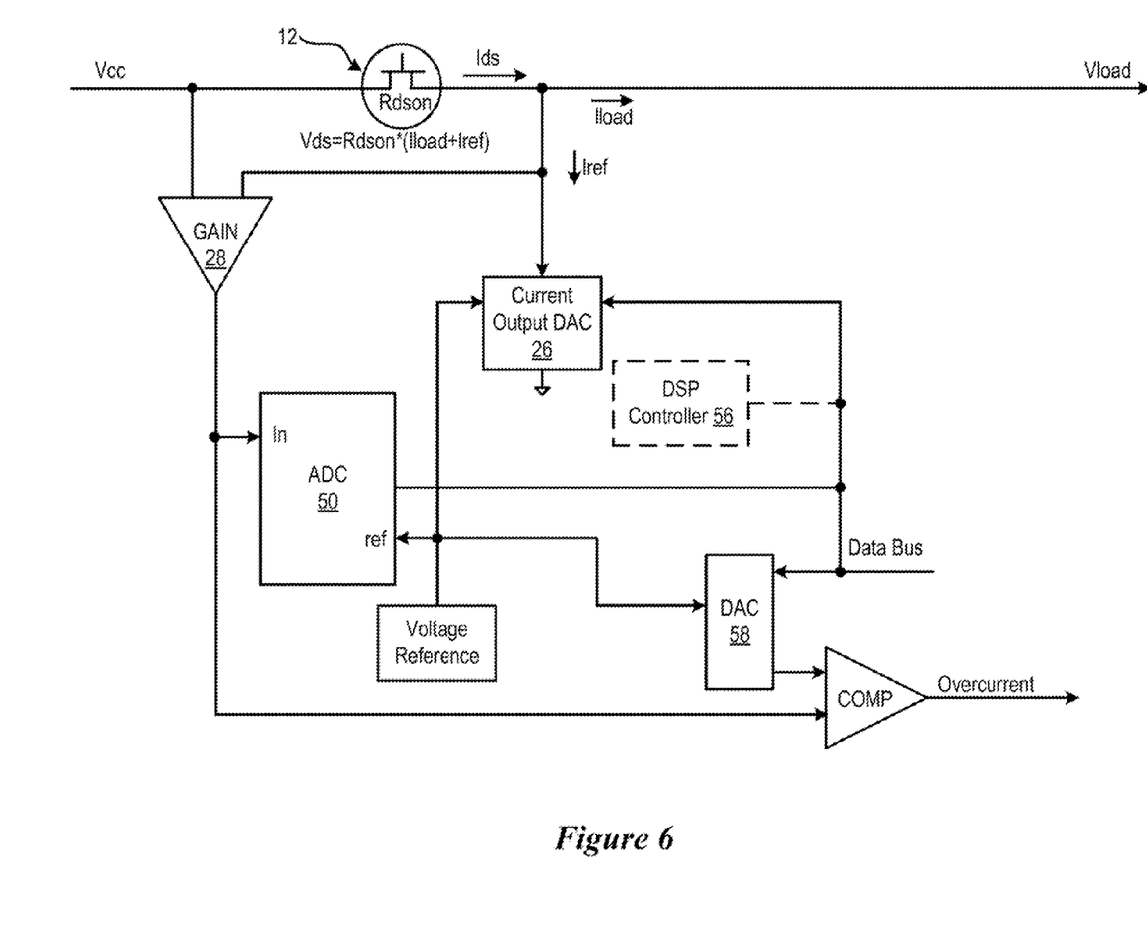
FIG. 6 depicts an example of a software-enabled circuit for detection of a current load across a MOSFET.

Referring now to FIGS. 4, 5 and 6, example embodiments of the present invention are depicted with analog, digital and software components respectively. FIG. 4 depicts an analog embodiment that provides a reference current with a ramp 42 and VCO 44. The signal from VCO 44 is divided by a counter 46 to control the reference current sink for the Iref signal from current source 34 and to provide a clock to ADC 32 that is coordinated with the Iref signal. The matched bandpass filter 38 receives the original swept clock from VCO 44, which drives a switched capacitor or other tunable bandpass filter (SCBPF). The clock frequency/bandpass center frequency ratio of filter 38 is constant and equal to the division rate of the counter 46 so that, as the swept clock speeds up, so does the Iref signal, the filter center frequency and the ADC clock. FIG. 5 depicts a digital embodiment that provides a reference current with a numerically controlled oscillator (NCO) 48 in the place of VCO 44 used in the analog embodiment. The signal from differential amplifier 28 is digitized with an ADC 50 and passed through a digital bandpass filter 52 and digital lowpass filter 54. A digital divider acts as load current detector 32 that divides the outputs from filters 52 and 54 to output Iload divided by Iref. FIG. 6 depicts a software-enabled embodiment that provides the reference current with a digital to analog reference current generator 26. The output of differential amplifier 28 is digitized with ADC 50, and the resistance detection and load current detection are performed with logic running on a DSP controller 56.

In alternative embodiments, Iload detection on multiple channels is provided by multiplexing the output from each channel in front of a sense amp, such as for monitoring multiple rails. In addition, monitoring of switching regulators is provided by using the switching frequency of the regulators as another level of modulation so that the MOSFET on time represents a periodic enabling of load current monitoring.

Although the present invention has been described in detail, it should be understood that various changes, substitutions and alterations can be made hereto without departing from the spirit and scope of the invention as defined by the appended claims.

What is claimed is:

1. A system for detecting load current across an electronic component, the system comprising:
    a differential amplifier interfaced with the electronic component and operable to detect voltage drop across the electronic component;
    a reference current generator interfaced with the electronic component and operable to generate a reference current having a distinguishable characteristic and to apply the reference current to the electronic component by adding the reference current to the load current;
    a component resistance detector interfaced with the reference current generator and the differential amplifier, the component resistance detector operable to analyze the reference current to determine a voltage drop of the reference current across the electronic component, wherein the component resistance detector comprises first and second filters, the first filter operable to isolate a voltage drop associated with the reference current, the second filter operable to isolate a voltage drop associated with the load current; and
    a load current detector interfaced with the component resistance detector operable to apply the voltage drop to determine the load current across the electronic component.

2. The system of claim 1 wherein the electronic component comprises a MOSFET.

3. The system of claim 1 wherein the first and second filters comprise analog filters and the load current detector comprises an analog to digital converter that accepts the voltage drops associated with the reference and load currents and outputs a ratio of the voltage drops.

4. The system of claim 1 wherein the first and second filters comprise digital filters and the load current detector comprises a divider that accepts the voltage drops associated with the reference and load currents and outputs a ratio of the voltage drops.

5. The system of claim 1 wherein the distinguishable characteristic comprises swept frequency modulation.

* * * * *